United States Patent
Zhang

(10) Patent No.: US 9,276,233 B2
(45) Date of Patent: Mar. 1, 2016

(54) ENCAPSULATING STRUCTURE OF OLED DEVICE

(71) Applicant: BOE TECHNOLOGY GROUP CO., LTD., Beijing (CN)

(72) Inventor: Yuxin Zhang, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 14/359,810

(22) PCT Filed: Dec. 2, 2013

(86) PCT No.: PCT/CN2013/088272
§ 371 (c)(1),
(2) Date: May 21, 2014

(87) PCT Pub. No.: WO2015/043056
PCT Pub. Date: Apr. 2, 2015

(65) Prior Publication Data
US 2015/0221889 A1    Aug. 6, 2015

(30) Foreign Application Priority Data
Sep. 24, 2013  (CN) .......................... 2013 1 0439395

(51) Int. Cl.
*H01L 51/52*       (2006.01)

(52) U.S. Cl.
CPC ................................. *H01L 51/5246* (2013.01)

(58) Field of Classification Search
CPC . H01L 22/12; H01L 29/7875; H01L 29/7878; H01L 51/5271; H01L 51/5268; H01L 51/0096; H01L 51/56; H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254; Y10S 977/742

USPC ......... 257/12–13, 40, 81, 84, 87–89, 98–100, 257/347–348, 433–434; 313/112, 501, 503, 313/506–507
See application file for complete search history.

(56) References Cited

U.S. PATENT DOCUMENTS

| 7,145,290 B2 | 12/2006 | Kang | |
| 7,268,489 B2 * | 9/2007 | Kim et al. | 313/506 |
| 8,013,526 B2 * | 9/2011 | Allemand | 313/512 |

(Continued)

FOREIGN PATENT DOCUMENTS

| CN | 1622700 A | 6/2005 |
| CN | 101009318 A | 8/2007 |

(Continued)

OTHER PUBLICATIONS

International Search Report, International Preliminary Report on Patentability and Written Opinion of the International Searching Authority of PCT/CN2013/088272 in Chinese, mailed Jun. 23, 2014.

(Continued)

*Primary Examiner* — Dung Le
(74) *Attorney, Agent, or Firm* — Collard & Roe, P.C.

(57) ABSTRACT

An encapsulating structure of an OLED device, comprising an upper substrate and a lower substrate that are disposed in opposition to each other, an OLED device, and a frit wall for sealing peripheries of the upper substrate and the lower substrate; two faces of the upper substrate and the lower substrate that are opposed abut against each other, the lower substrate has a recessed section, which is opened toward the upper substrate and within which the OLED device is positioned; the upper substrate has a first annular groove that is opened toward the lower substrate, the lower substrate has a second annular groove that is opposed to the first annular groove and opened toward the upper substrate, an upper bound of the frit wall is located in the first annular groove, and a lower bound of the frit wall is located in the second annular groove. The encapsulation stability of the encapsulating structure is relatively high, and service life of the OLED device is relatively long.

19 Claims, 3 Drawing Sheets

(56) References Cited

U.S. PATENT DOCUMENTS 8,999,762 B2 * 4/2015 Baillin et al. .................. 438/124
2002/0155320 A1 * 10/2002 Park et al. ..................... 428/690

FOREIGN PATENT DOCUMENTS

| CN | 203481280 U | 3/2014 |
| JP | 2011-165497 A | 8/2011 |

OTHER PUBLICATIONS

English Translation of the International Search Report of PCT/CN2013/088272 published in English on Apr. 2, 2015.

Chinese Office Action of Chinese Application No. 201310439395.0, mailed May 20, 2015 with English translation.

Second Chinese Office Action of Chinese Application No. 201310439395.0, mailed Dec. 4, 2015 with English translation.

* cited by examiner

ENCAPSULATING STRUCTURE OF OLED DEVICE

CROSS REFERENCE TO RELATED APPLICATIONS

This application is the National Stage of PCT/CN2013/088272filed on Dec. 2, 2013, which claims priority under 35 U.S.C. §119 of Chinese Application No. 201310439395.0 filed on Sept. 24, 2013, the disclosure of which is incorporated by reference.

TECHNICAL FIELD

Embodiments of the present invention relate to an encapsulating structure of an OLED device.

BACKGROUND

An OLED device refers to such an electroluminescent device that consists of an organic semiconductor material and a luminous material and is caused to emit light by injection and recombination of carriers that are carried out as the device is driven by an electric field. OLED devices have more advantages, and have bright prospects in the field of display. OLED devices are very sensitive to water vapor and oxygen gas, and water vapor and oxygen gas that permeate into OLED devices are main factors that affect lifetime of the OLED devices. Therefore, OLED devices mostly are encapsulated with an encapsulating structure, so as to serve a function of obstruction to oxygen gas and water vapor.

A laser frit encapsulation is an encapsulating mode for OLED devices, and applied mainly to the encapsulation of OLED devices of a medium size and a small size.

FIG. 1 is a structurally schematic view illustrating an encapsulating structure for a conventional OLED device, in which the laser frit encapsulation is adopted. As shown in FIG. 1, the laser frit encapsulation structure has an upper substrate 03 and a lower substrate 02 disposed in opposition to each other, peripheries of the upper substrate 03 and the lower substrate 02 are sealed and supported by a frit wall 04, an OLED device 01 is positioned within a cavity 05 formed by the upper substrate 03, the lower substrate 02 and the frit wall 04, and the cavity 05 is filled with nitrogen gas.

In the above encapsulation structure for OLED device, the frit wall 04 is formed by heating a frit to melt with the movement of a laser beam. Although the frit wall 04 can have a good obstructing property with respect to water vapor and oxygen gas, adhesion forces between the fit wall 04 and the upper substrate 03 and between the fit wall 04 and the lower substrate 02 may be inadequate, and the frit wall 04 is liable to be broken under the action of an external force. In turn, this causes oxygen gas and water vapor outside the cavity 05 to permeate into the OLED device, and service life of the OLED device is reduced.

Therefore, the encapsulation stability of the conventional OLED encapsulating structure become worse, and then it leads to a lower serve life of the OLED device.

SUMMARY

According to embodiments of the present invention, there is provided an encapsulating structure of an OLED device, which has higher encapsulation stability, and the OLED device with which has a longer serve life.

In an embodiment of the invention, there is provided an encapsulating structure of an OLED device, comprising an upper substrate and a lower substrate that are disposed in opposition to each other, an OLED device, and a frit wall for sealing peripheries of the upper substrate and the lower substrate; two faces of the upper substrate and the lower substrate that are opposed abut against each other, the lower substrate has a recessed section, which is opened toward the upper substrate and within which the OLED device is positioned; the upper substrate has a first annular groove that is opened toward the lower substrate, the lower substrate has a second annular groove that is opposed to the first annular groove and opened toward the upper substrate, an upper bound of the frit wall is located in the first annular groove, and a lower bound of the frit wall is located in the second annular groove.

For example, on a side of the OLED device facing the upper substrate, there is provided a sealing layer, which hermetically fits to the periphery of the recessed section of the lower substrate, so as to seal the OLED device at the bottom of the recessed section. The sealing layer can further act to block oxygen gas and water vapor, and then service life the OLED device can be prolonged.

For example, a side wall of the recessed section has a stepwise configuration, in which, a step face provided by the side wall of the recessed section is parallel to a bottom face of the recessed section and the OLED device 1 is disposed at the bottom face of the recessed section, a side of the sealing layer facing the bottom face of the recessed section hermetically fits to the step face in the recessed section, and a top surface of the sealing layer is flush with a top surface of the lower substrate.

For example, the sealing layer is a sealing layer formed of an encapsulating thin film of at least one layer.

For example, the sealing layer includes multiple layers of an organic thin film, or multiple layers of an inorganic thin film, or multiple layers of an organic thin film and an inorganic thin film that are laminated alternately. For example, the organic thin film is an organic thin film produced by polyimide, polyurea, polyamic acid, polyacrylic acid, polyester, polyethylene, or polypropylene; and the inorganic thin film is an inorganic thin film produced with SiOx, SiNx, SiCxNy, SiOxNy, AlOx, SnO2, AlN, MgF2, CaF2, In2O3 or ITO.

For example, the sealing layer is a sealing layer formed of a resin material.

For example, the sealing layer includes a drying layer and a filling layer located between the drying layer and the upper substrate. For example, the filling layer is a transparent filling layer formed of silicon oil, resin or liquid crystal.

For example, the recessed section has two step faces, the drying layer hermetically fits to one of the step faces, and the filling layer hermetically fits to the other one of the step faces.

For example, the shape of a cross-section of the first annular groove is an arc, a triangle, a rectangle or a trapezoid; and the shape of a cross-section of the second annular groove is an arc, a triangle, a rectangle or a trapezoid.

For example, the upper substrate and the lower substrate are glass substrates.

The encapsulation stability of the encapsulating structure of the OLED device provided by embodiments of the invention is relatively high, and service life of the OLED device is relatively long.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) within the scope sought for protection by the invention.

Figure 1:
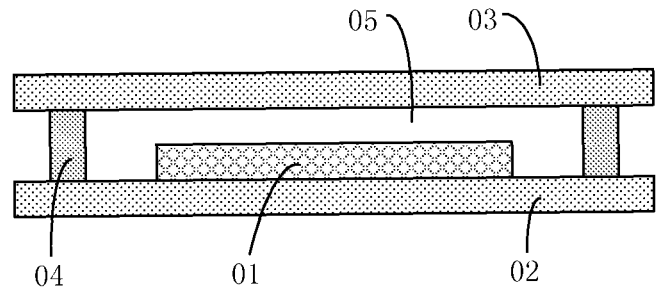
FIG. 1 is a structurally schematic view illustrating an OLED device encapsulating structure with a conventional laser frit encapsulation.
Figure 2:
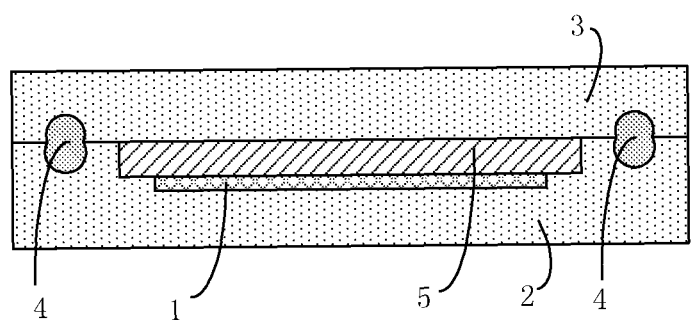
FIG. 2 is a structurally schematic view illustrating an encapsulating structure for an OLED device provided by an embodiment of the invention.
Figure 3:
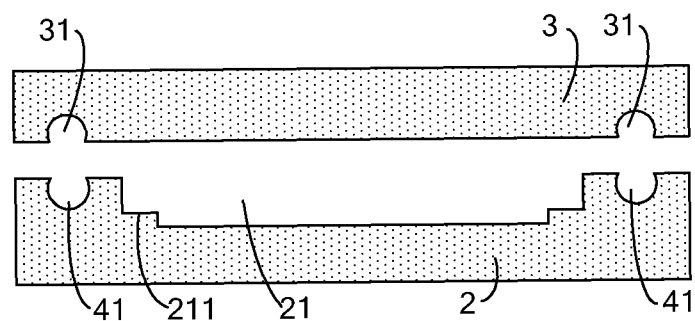
FIG. 3 is a schematic view illustrating a mating structure of an upper substrate and a lower substrate in an encapsulation structure of an OLED device provided by an embodiment of the invention.
Figure 4:
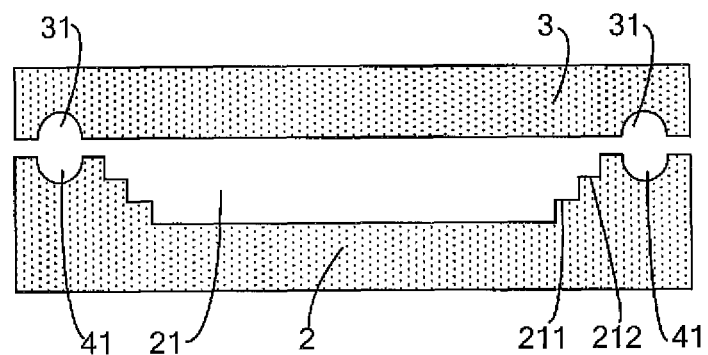
FIG. 4 is a schematic view illustrating another mating structure of an upper substrate and a lower substrate in an encapsulation structure of an OLED device provided by an embodiment of the invention.

FIG. 2 is a structurally schematic view illustrating an encapsulating structure for an OLED device provided by an embodiment of the invention; FIG. 3 is a schematic view illustrating a mating structure of an upper substrate and a lower substrate in an encapsulation structure of an OLED device provided by an embodiment of the invention; and FIG. 4 is a schematic view illustrating another mating structure of an upper substrate and a lower substrate in an encapsulation structure of an OLED device provided by an embodiment of the invention.

An encapsulating structure for an organic light emitting diode (OLED) device provided by an embodiment of the invention, as shown in FIG. 2, includes an upper substrate 3 and a lower substrate 2 disposed in opposition to each other, an OLED device 1, and a frit wall 4 for sealing peripheries of the upper substrate 3 and the lower substrate 2. The two faces of the upper substrate 3 and the lower substrate 2 in opposition to each other abut against each other. The lower substrate 2 has a recessed section 21 that is opened toward the upper substrate 3, and the OLED device 1 is positioned within the recessed section 21. The upper substrate 3 has a first annular groove 31 that is opened toward the lower substrate 2, and the lower substrate 2 has a second annular groove 41 that is opposed to the first annular groove 31 and is opened toward the upper substrate 3. An upper bound of the frit wall 4 is located in the first annular groove 31, and a lower bound of the frit wall 4 is located in the second annular groove 41.

In the above encapsulation structure of the OLED device, the upper substrate 3 and the lower substrate 2 are disposed in opposition to each other, and two faces of the upper substrate 3 and the lower substrate 2 in opposition to each other abut against each other, while the OLED device 1 is location within the recessed section 21 provided by the lower substrate 2 that is opened toward the upper substrate. An upper bound of the frit wall 4 for sealing peripheries of the upper substrate 3 and the lower substrate 2 is located within the first annular groove 31 provided by the upper substrate 3, and a lower bound of the frit wall 4 is located within the second annular groove 41 provided by the lower substrate 2. The contact area between the frit wall 4 and the upper substrate 3 includes the bottom and side walls of the first annular groove 31, and the contact area between the frit wall 4 and the lower substrate 2 includes the bottom and side walls of the second annular groove 41. Due to the fact that two facing faces of the upper substrate 3 and the lower substrate 2 abut against each other, and the first annular groove 31 and the second annular groove 41 are disposed in opposition to each other so that the fit wall 4 is completely cladded by the upper substrate 3 and the lower substrate 2, the adhesion force between the frit wall 4 and the upper substrate 3 is relatively large, and the adhesion force between the frit wall 4 and the lower substrate 2 is relatively large. Furthermore, as the frit wall 4 is cladded by the upper substrate 3 and the lower substrate 2, it is not easily broken under the action of an external force.

So, the encapsulation stability of the encapsulating structure of the OLED device provided by the invention is relatively high, and the service life of the whole OLED device after encapsulation is relatively long.

Please continue to refer to FIG. 2. In order to further prolong the service life of the OLED device 1, in a preferred embodiment of an encapsulating structure of an OLED device provided by the embodiment, on a side of the OLED device 1 facing the upper substrate 3, there is provided a sealing layer 5, which hermetically fits to the periphery of the recessed section 21 of the lower substrate 2, so as to seal the OLED device 1 at the bottom of the recessed section 21. The sealing layer 5 can further act to block oxygen gas and water vapor so as to reduce an effect of oxygen gas and water vapor on the OLED device 1, and in turn, service life of the OLED device can be prolonged.

Please continue to refer to FIG. 2, FIG. 3 and FIG. 4. In a preferred embodiment of an OLED encapsulating structure provided by the embodiment, as shown in FIG. 2, a side wall of the recessed section 21 provided by the lower substrate 2 has a stepwise configuration, in which, a step face 211 provided by the side wall of the recessed section 21 is parallel to a bottom face of the recessed section 21 and the OLED device 1 is disposed at the bottom face of the recessed section 21, the periphery of the sealing layer 5 on a side facing the bottom face of the recessed section 21 hermetically fits to the step face 211 in the recessed section 21, and a top surface of the sealing layer 5 is flush with a top surface of the lower substrate 2. As shown in FIG. 2, a bottom surface of the sealing layer 5 hermetically fits to the step face 211 existing in the recessed section 21, and then the OLED device 1 can be sealed at the bottom of the recessed section 21.

Figure 5:
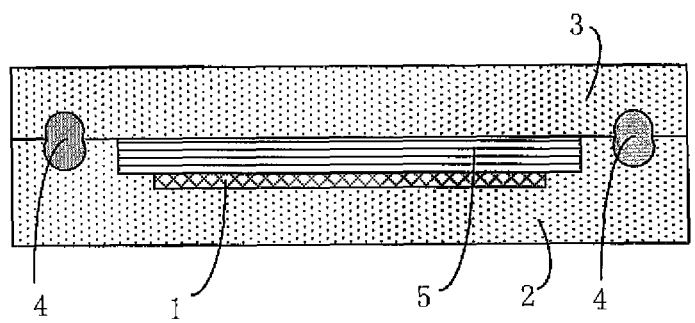
FIG. 5 is a structurally schematic view illustrating an encapsulating structure for an OLED device provided by an embodiment of the invention, when an encapsulating layer therein includes a plurality of encapsulating thin films.

Please referring to FIG. 5, in an optional embodiment, the sealing layer 5 may be a sealing layer formed of an encapsulating thin film of at least one layer.

Based on the above embodiment, the sealing layer 5 may be formed of an encapsulating thin film of one layer, or may be formed of an encapsulating thin film of multiple layers. When the sealing layer 5 is formed of an encapsulating thin film of multiple layers, the sealing layer 5 may include multiple layers of an organic thin film, or multiple layers of inorganic thin film, or multiple layers of an organic thin film and an inorganic thin film that are laminated alternately.

For example, the organic thin film may be an organic thin film produced by polyimide, polyurea, polyamic acid, polyacrylic acid, polyester, polyethylene, or polypropylene; the inorganic thin film may be an inorganic thin film produced by $SiO_x$, $SiN_x$, $SiC_xN_y$, $SiO_xN_y$, $AlO_x$, $SnO_2$, $AlN$, $MgF_2$, $CaF_2$, $In_2O_3$ or ITO.

Please continue to refer to FIG. 2. In a preferred embodiment, the sealing layer 5 may also be a sealing layer formed of a resin material.

Figure 6:
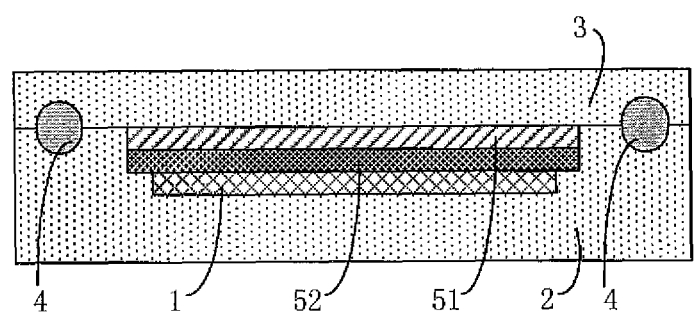
FIG. 6 is a structurally schematic view illustrating an encapsulating structure for an OLED device provided by an embodiment of the invention, when an encapsulating layer therein includes a drying layer and a filling layer.

Certainly, please referring to FIG. 6, in a preferred embodiment, the sealing layer 5 may further include a drying layer 52 and a filling layer 51 located between the drying layer 52 and the upper substrate 3. Provision of the drying layer 52 can act to prevent water vapor from entering the OLED device better.

Figure 9:
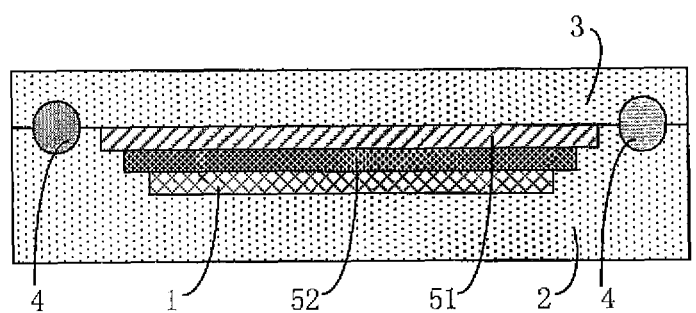
FIG. 9 is a structurally schematic view illustrating an encapsulating structure for an OLED device provided by an embodiment of the invention, when a depressed section of a lower substrate therein has two step faces.

For example, the filling layer 51 may be a transparent filling layer formed of silicon oil, resin or liquid crystal. The transparent filling layer can act to further obstruct water vapor and oxygen gas from entering the OLED device. Please referring to FIG. 4 and FIG. 9, based on the above embodiment, a side wall of the recessed section 21 of the lower substrate 2 has two step faces, which are a step face 211 and a step face 212, respectively. Here, the drying layer 52 hermetically fits to the step face 211, and the filling layer 51 hermetically fits to the step face 212. A layer for sealing is formed between the drying layer 52 and the step face 211, and another layer for sealing is formed between the filling layer 52 and the step face 212. Namely, an encapsulating structure of two layers is formed between the OLED device 1 and the top surface of the lower substrate 2, so that a hermetically isolate function of the sealing layer 5 on the OLED device 1 is further improved. Certainly, the side wall of the recessed section 21 of the lower substrate 2 may also have a plurality of step faces so as to form an encapsulating structure of multiple layers, and specifics can be set according to actual encapsulating requirements.

Figure 7:
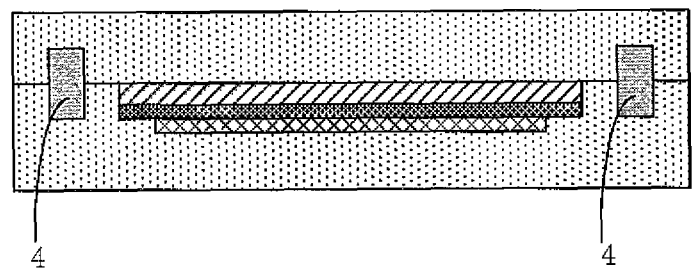
FIG. 7 is a structurally schematic view illustrating an encapsulating structure for an OLED device provided by an embodiment of the invention, when a first annular groove and a second annular groove therein each have a rectangular cross-section.
Figure 8:
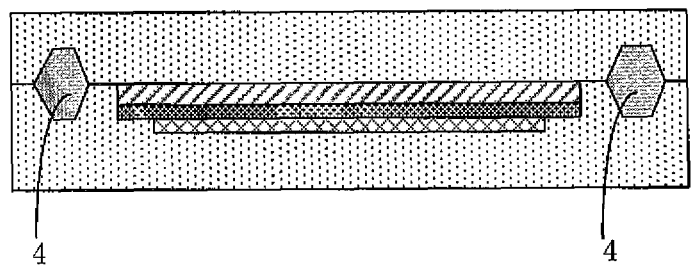
FIG. 8 is a structurally schematic view illustrating an encapsulating structure for an OLED device provided by an embodiment of the invention, when a first annular groove and a second annular groove therein each have a trapezoidal cross-section.

Preferably, as shown in FIG. 6, the shape of a cross-section of the first annular groove 31 provided by the upper substrate 3 may be of an arc; or, the shape of a cross-section of the first annular groove 31 provided by the upper substrate 3 may also be of a triangle; or, as shown in FIG. 7, the shape of a cross-section of the first annular groove 31 provided by the upper substrate 3 may also be of a rectangle; or, as shown in FIG. 8, the shape of a cross-section of the first annular groove 31 provided by the upper substrate 3 may also be of a trapezoid.

Likewise, as shown in FIG. 6, the shape of a cross-section of the second annular groove 41 provided by the lower substrate 2 may be of an arc; or, the shape of a cross-section of the second annular groove 41 provided by the lower substrate 2 may also be of a triangle; or, as shown in FIG. 7, the shape of a cross-section of the second annular groove 41 provided by the lower substrate 2 may also be of a rectangle; or, as shown in FIG. 8, the shape of a cross-section of the second annular groove 41 provided by the lower substrate 2 may also be of a trapezoid.

Of course, on the basis of facilitating the processing and ensuring adhesion forces between the frit wall 4 and the upper substrate 3 and between the fit wall 4 and the lower substrate 2, the shape of the cross-section of the first annular groove 31 provided by the upper substrate 3 and the shape of the cross-section of the second annular groove 41 provided by the lower substrate 2 can also have other options, and they will not be given by example one by one.

The upper substrate 3 and the lower substrate 2 provided in the above technical solution may be glass substrates, so as to enhance adhesion forces between the frit wall 4 and the upper substrate 3 and between the frit wall 4 and the lower substrate 2.

It is to be noted that, the sealing layer 5 stated in various embodiments of the invention is transparent, and thus it will not bring an effect on light existing efficiency of the OLED device.

Descriptions made above are merely exemplary embodiments of the invention, but are not used to limit the protection scope of the invention. The protection scope of the invention is determined by attached claims.

The invention claimed is:

1. An encapsulating structure of an OLED device, comprising an upper substrate and a lower substrate that are disposed in opposition to each other, an OLED device, and a frit wall for sealing peripheries of the upper substrate and the lower substrate;
   wherein two faces of the upper substrate and the lower substrate that are opposed abut against each other, the lower substrate has a recessed section, which is opened toward the upper substrate and within which the OLED device is positioned; the upper substrate has a first annular groove that is opened toward the lower substrate, the lower substrate has a second annular groove that is opposed to the first annular groove and opened toward the upper substrate, an upper bound of the frit wall is located in the first annular groove, and a lower bound of the frit wall is located in the second annular groove.

2. The encapsulating structure claimed as claim 1, wherein on a top side of the OLED device facing the upper substrate, there is provided a sealing layer, which hermetically fits to a periphery of the recessed section of the lower substrate, so as to seal the OLED device at the bottom of the recessed section.

3. The encapsulating structure claimed as claim 2, wherein a side wall of the recessed section has a stepwise configuration, in which, a step face provided by the side wall of the recessed section is parallel to a bottom face of the recessed section and the OLED device is disposed at the bottom face of the recessed section, a side of the sealing layer facing the bottom face of the recessed section hermetically fits to the step face in the recessed section, and a top surface of the sealing layer is flush with a top surface of the lower substrate.

4. The encapsulating structure claimed as claim 2, wherein the sealing layer is a sealing layer formed of an encapsulating thin film of at least one layer.

5. The encapsulating structure claimed as claim 2, wherein the sealing layer includes multiple layers of an organic thin film, or multiple layers of an inorganic thin film, or multiple layers of an organic thin film and an inorganic thin film that are laminated alternately.

6. The encapsulating structure claimed as claim 5, wherein the organic thin film is an organic thin film produced by polyimide, polyurea, polyamic acid, polyacrylic acid, polyester, polyethylene, or polypropylene; and the inorganic thin film is an inorganic thin film produced with SiOx, SiNx, SiCxNy, SiOxNy, AlOx, SnO2, AlN, MgF2, CaF2, In2O3 or ITO.

7. The encapsulating structure claimed as claim 2, wherein the sealing layer is a sealing layer formed of a resin material.

8. The encapsulating structure claimed as claim 2, wherein the sealing layer includes a drying layer and a filling layer located between the drying layer and the upper substrate.

9. The encapsulating structure claimed as claim 8, wherein the filling layer is a transparent filling layer formed of silicon oil, resin or liquid crystal.

10. The encapsulating structure claimed as claim 8, wherein a side wall of the recessed section has two step faces, the drying layer hermetically fits to one of the step faces, and the filling layer hermetically fits to the other one of the step faces.

11. The encapsulating structure claimed as claim 1, wherein a shape of a cross-section of the first annular groove is of an arc, a triangle, a rectangle or a trapezoid; and
a shape of a cross-section of the second annular groove is of an arc, a triangle, a rectangle or a trapezoid.

12. The encapsulating structure claimed as claim 1, wherein the upper substrate and the lower substrate are glass substrates.

13. The encapsulating structure claimed as claim 3, wherein the sealing layer is a sealing layer formed of an encapsulating thin film of at least one layer.

14. The encapsulating structure claimed as claim 3, wherein the sealing layer includes multiple layers of an organic thin film, or multiple layers of an inorganic thin film, or multiple layers of an organic thin film and an inorganic thin film that are laminated alternately.

15. The encapsulating structure claimed as claim 14, wherein the organic thin film is an organic thin film produced by polyimide, polyurea, polyamic acid, polyacrylic acid, polyester, polyethylene, or polypropylene; and
the inorganic thin film is an inorganic thin film produced with SiOx, SiNx, SiCxNy, SiOxNy, AlOx, SnO2, AlN, MgF2, CaF2, In2O3 or ITO.

16. The encapsulating structure claimed as claim 3, wherein the sealing layer is a sealing layer formed of a resin material.

17. The encapsulating structure claimed as claim 3, wherein the sealing layer includes a drying layer and a filling layer located between the drying layer and the upper substrate.

18. The encapsulating structure claimed as claim 17, wherein the filling layer is a transparent filling layer formed of silicon oil, resin or liquid crystal.

19. The encapsulating structure claimed as claim 17, wherein a side wall of the recessed section has two step faces, the drying layer hermetically fits to one of the step faces, and the filling layer hermetically fits to the other one of the step faces.

* * * * *